US005830779A

United States Patent [19]
Bressler et al.

[11] Patent Number: 5,830,779
[45] Date of Patent: Nov. 3, 1998

[54] METHOD OF MAKING PHOTOVOLTAIC MODULE

[75] Inventors: Peter W. Bressler; John D. Coleman, both of Philadelphia, Pa.

[73] Assignee: Bressler Group Inc., Philadelphia, Pa.

[21] Appl. No.: 779,101

[22] Filed: Jan. 6, 1997

Related U.S. Application Data

[62] Division of Ser. No. 498,734, Jul. 6, 1995, Pat. No. 5,590,495.

[51] Int. Cl.$^6$ .................................................. H01L 31/18
[52] U.S. Cl. ................................ 438/65; 438/66; 438/67; 156/269; 156/271; 156/301; 156/302; 156/308.2; 156/324; 136/251
[58] Field of Search ........................... 437/2–5, 205, 437/207, 211–212; 156/301, 302, 308.2, 324, 269, 271; 136/251; 438/65–67

[56] References Cited

U.S. PATENT DOCUMENTS

| | | | |
|---|---|---|---|
| 2,724,303 | 11/1955 | Holcomb | 411/439 |
| 3,025,569 | 3/1962 | Riggs | 264/154 |
| 3,299,766 | 1/1967 | Gould et al. | 411/371 |
| 3,446,262 | 5/1969 | Phipard, Jr. | 411/257 |
| 3,592,100 | 7/1971 | Trumbull et al. | 411/403 |
| 4,040,867 | 8/1977 | Forestieri et al. | 136/244 |
| 4,080,221 | 3/1978 | Manelas | 136/248 |
| 4,104,083 | 8/1978 | Hirano | 136/259 |
| 4,122,396 | 10/1978 | Grazier et al. | 455/343 |
| 4,189,881 | 2/1980 | Hawley | 52/91.3 |
| 4,239,555 | 12/1980 | Schlarlack et al. | 136/251 |
| 4,321,416 | 3/1982 | Tennant | 136/244 |
| 4,400,577 | 8/1983 | Spear | 136/259 |
| 4,674,244 | 6/1987 | Francovitch | 52/173.3 |
| 4,677,248 | 6/1987 | Lacey | 136/244 |
| 4,860,509 | 8/1989 | Laaly et al. | 52/173.3 |
| 4,871,289 | 10/1989 | Choiniere | 411/48 |
| 4,886,554 | 12/1989 | Woodring et al. | 136/244 |
| 4,946,512 | 8/1990 | Fukuroi et al. | 136/248 |
| 4,964,774 | 10/1990 | Lat et al. | 411/48 |
| 4,987,714 | 1/1991 | Lemke | 52/410 |
| 5,006,179 | 4/1991 | Gaddy | 136/244 |
| 5,009,721 | 4/1991 | Matsumoto et al. | 136/256 |
| 5,022,381 | 6/1991 | Allegro | 126/622 |
| 5,078,561 | 1/1992 | Wollar et al. | 411/38 |
| 5,149,237 | 9/1992 | Gabriel et al. | 411/446 |
| 5,164,020 | 11/1992 | Wagner et al. | 136/251 |
| 5,178,503 | 1/1993 | Losada | 411/441 |
| 5,180,442 | 1/1993 | Elias | 136/251 |
| 5,232,518 | 8/1993 | Nath et al. | 136/251 |
| 5,516,704 | 5/1996 | Yoshida | 437/2 |
| 5,584,940 | 12/1996 | Yoshida | 136/251 |

FOREIGN PATENT DOCUMENTS

| | | | |
|---|---|---|---|
| 55-125682 | 9/1980 | Japan | 136/251 |
| 57-45979 | 3/1982 | Japan | 136/251 |
| 60-148173 | 8/1985 | Japan | 136/257 |
| 60-148174 | 8/1985 | Japan | 136/257 |
| 61-287277 | 12/1986 | Japan | 136/251 |
| 5-190884 | 7/1993 | Japan | 136/251 |

OTHER PUBLICATIONS

Home Newsfront ("Sunroof For Houses"), *Popular Science*, Jan. 1993, p. 37.

*Primary Examiner*—Aaron Weisstuch
*Attorney, Agent, or Firm*—Panitch Schwarze Jacobs & Nadel, P.C.

[57] ABSTRACT

A photovoltaic module that serves as a shingle, tile or other building material that may be placed onto the exterior of a structure. The photovoltaic module generates a voltage when exposed to light and this voltage may be directed onto transmission lines of a power utility and/or into an external battery that may serve as a source of power for the building on which the photovoltaic shingles are laid. The practice of the present invention provides for a variety of mechanical and electrical connectors for securing together the photovoltaic modules and/or for connecting the photovoltaic modules to the exterior structure. Furthermore, the structure of the modules is such that the modules are automatically electrically connected together when laid on the building.

4 Claims, 12 Drawing Sheets

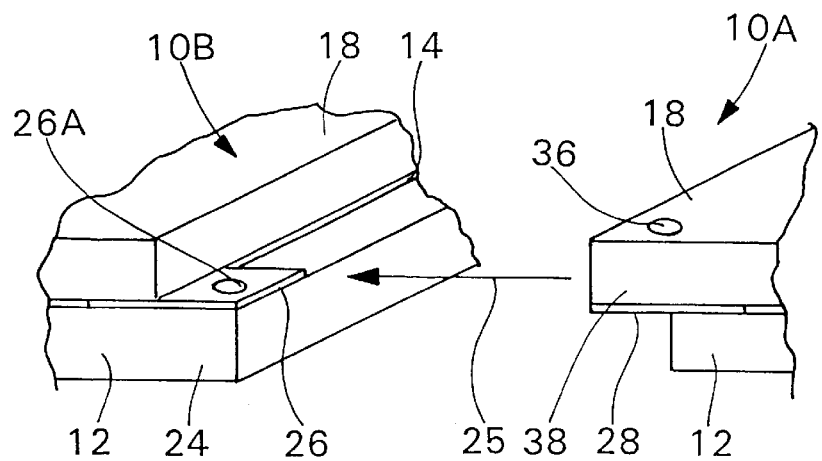
Fig. 4
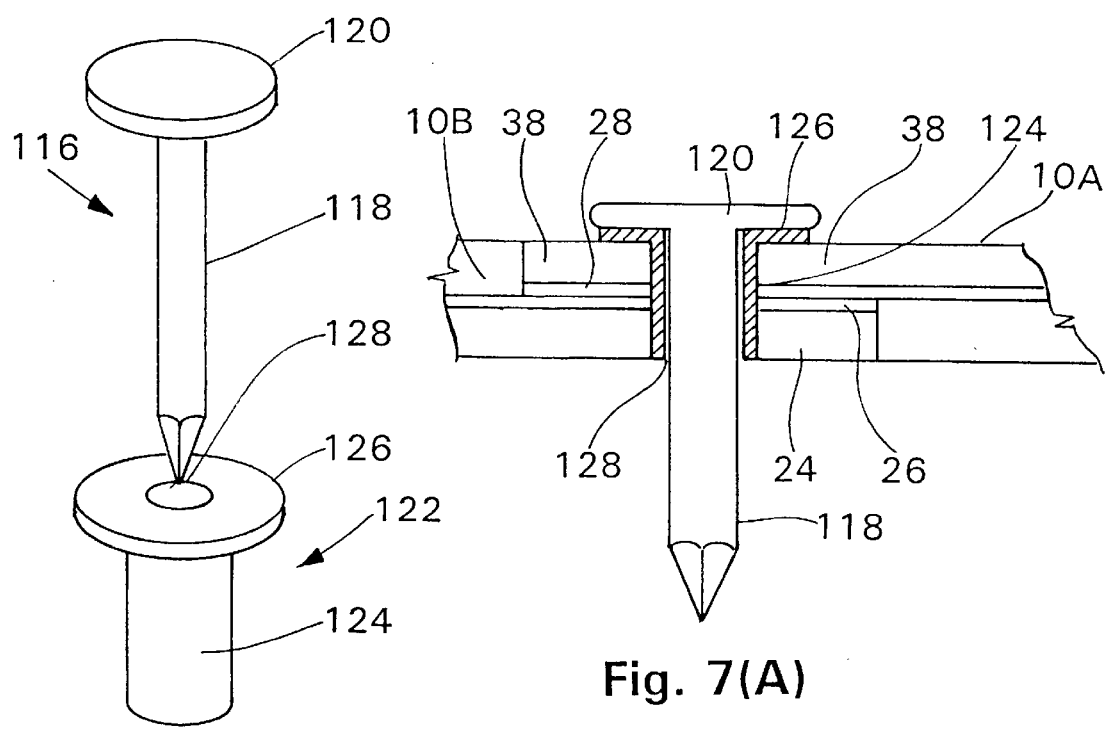
Fig. 7(A)
Fig. 7(B)

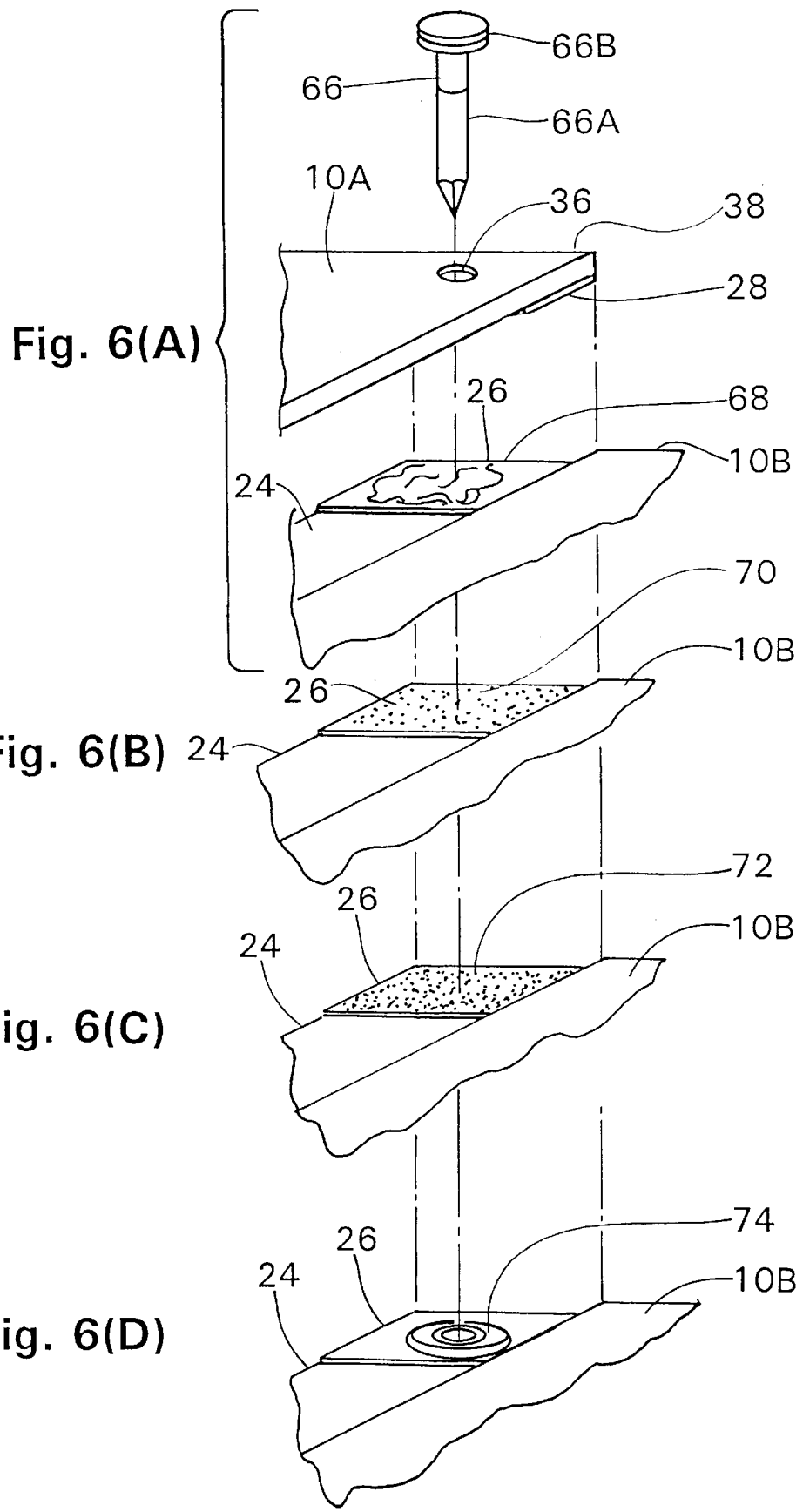

METHOD OF MAKING PHOTOVOLTAIC MODULE

This is a division of application Ser. No. 08/498,734, filed Jul. 6 1995, now U.S. Pat. No. 5,590,495.

FIELD OF THE INVENTION

The present invention relates to photovoltaic modules that generate a voltage when exposed to light. More particularly, the present invention relates to photovoltaic modules that are particularly suited for being used as shingles, tiles or other building materials that cover an exterior, such as a roof, of a structure and generate a voltage when exposed to light and which voltage is deliverable to a power utility or may be used for power consumption by household appliances located within the structure.

BACKGROUND OF THE INVENTION

A substantial amount of research and development has been carried out for the purpose of producing practical and economical photovoltaic voltage generating units. Photovoltaic generating units are well-known and one such unit is described in U.S. Pat. No. 4,321,416 (the '416 patent), herein incorporated by reference. The photovoltaic generating unit of the '416 patent is comprised of a plurality of modules connected to each other in accordance with a predetermined wiring arrangement to form an array to make their generated power available at output terminals of the array. The array of modules may serve as shingles that are secured to the roof or other surfaces of a structure by relatively complicated means comprising fasteners and oversized washers that are positioned and located relative to inactive portions of the photovoltaic modules. It is desired that a photovoltaic module be provided that has relatively simple means for being interconnected, both mechanically and electrically, into an array and to make its generated electrical power easily available for power consumption or power delivery purposes.

A shingle serving as a solar cell is also well-known and one such shingle is described in U.S. Pat. No. 4,040,867 (the '867 patent), herein incorporated by reference. The shingle disclosed in the '867 patent suffers some of the drawbacks of the '416 patent in that the electrical and mechanical interconnections of its shingles are established in a relatively complicated manner. Again, it is desired that a photovoltaic module be provided that not only serves as a shingle that generates a voltage when exposed to radiant energy, such as light, but also may be easily positioned and mechanically connected directly onto a roof and easily arranged into an electrical network that can be used to produce electrical power for consumption or delivery purposes.

Further, it is desired that a method be provided for conveniently forming photovoltaic modules. Conventional methods of forming photovoltaic modules are usually limited to forming one module at a time. Such a method significantly increases the cost of producing photovoltaic modules, thereby inhibiting the sales of the same. Thus, a need has arisen for a simple, efficient and inexpensive method of forming photovoltaic modules to provide a significant savings in the capitol expenditure necessary to manufacture and install photovoltaic modules on an exterior structure.

SUMMARY OF THE INVENTION

Briefly stated, the present invention is directed toward a photovoltaic module that may serve as a shingle, tile, or other construction device that is placed onto the exterior of a structure and exposed to the environment, especially sunlight, to generate an electrical voltage that can be gathered for power consumption or power delivery purposes. The photovoltaic module comprises a carrier layer including a non-porous building material, a photovoltaic layer which generates an electric current when exposed to light, and a layer of corrosive retarding material. The photovoltaic layer is positioned between and laminated to the carrier layer and the corrosive retarding layer. The photovoltaic module further comprises interconnecting leads that are in electrical communication with the photovoltaic layer and are used for outputting the electric current generated by the photovoltaic layer.

In one aspect of the present invention, the photovoltaic module may be used to develop a solar roofing system, wherein the photovoltaic modules are arranged so that the protruding ledge of the first module is situated on the resting edge of a second module such that a second connector of the first module is in electrical communication with the first connector of the second module. The photovoltaic modules may be arranged in a serial or parallel manner to make a DC electrical potential available for power consumption or power delivery purposes.

In another aspect of the present invention, the roofing system comprising at least first and second photovoltaic modules each generating a DC electricity when exposed to light and the first and second modules being arranged so that the first module has a first DC polarity potential at its first connector and the second module has a second DC polarity potential at its second connector. The first connector of the first module is connected to the first end of a first conductive bus and the second connector of the second module is connected to the first end of a second conductive bus. Each of the second ends of the first and second conductive busses are respectively connected to the first and second inputs of a network for inverting the DC electricity generated by the photovoltaic modules to AC power for being applied to an input stage of a power utility having power transmission lines. The inverting network comprises a DC/AC inverter, and an isolation transformer. The DC/AC inverter has first and second inputs, formed by the second ends of the first and second conductive busses, applied thereto and generates a first AC output voltage having a power factor approaching unity and suitable for being applied to the transmission lines of the power utility. The isolation transformer accepts the first AC output voltage and develops a second output voltage which is routed to the input switching stage of the power utility.

A still further aspect of the present invention includes a method for producing a plurality of photovoltaic modules for use in covering a roof. The method comprises the steps of providing a first feed roller having a first generally continuous sheet of a non-porous building material having a first predetermined width thereon, and also providing a second feed roller having a second generally continuous sheet thereon with the second sheet comprising a layer having dissimilar materials that generates an electric current when exposed to light. The second sheet has first and second electrically conductive connectors. The method further comprises the steps of moving the first and second sheets each in a predetermined path, merging and bonding together the first and second sheets in a facing relationship, and cutting the bonded first and second sheets into individual photovoltaic modules.

BRIEF DESCRIPTION OF THE DRAWINGS

The foregoing summary, as well as the following detailed description of the preferred embodiments of the invention, will be better understood when read in conjunction with the appended drawings. For the purpose of illustrating the invention there is shown in the drawings embodiments which are presently preferred. It should be understood, however, that the present invention is not limited to the particular arrangements and instrumentalities shown. In the drawings:

FIG. 4 is an enlarged, partial, exploded, perspective view of an overlapping arrangement of the resting ledge of one photovoltaic module with the protruding ledge of another photovoltaic module;

FIG. 6(A) is a greatly enlarged, partial-exploded perspective view which illustrates a first embodiment of a fastener for electrically and mechanically mating together first and second photovoltaic modules;

FIGS. 6(B), 6(C), and 6(D) are partial perspective views which illustrate, respectively, second, third and fourth embodiments of a fastener for electrically and mechanically mating together first and second photovoltaic modules;

FIG. 7(A) is a greatly enlarged, elevational view which illustrates an eighth embodiment of a fastener for electrically and mechanically mating together first and second photovoltaic modules;

FIG. 7(B) is an exploded perspective view of the fastener shown in FIG. 7(A);

DETAILED DESCRIPTION OF THE PREFERRED EMBODIMENTS

Figure 1:
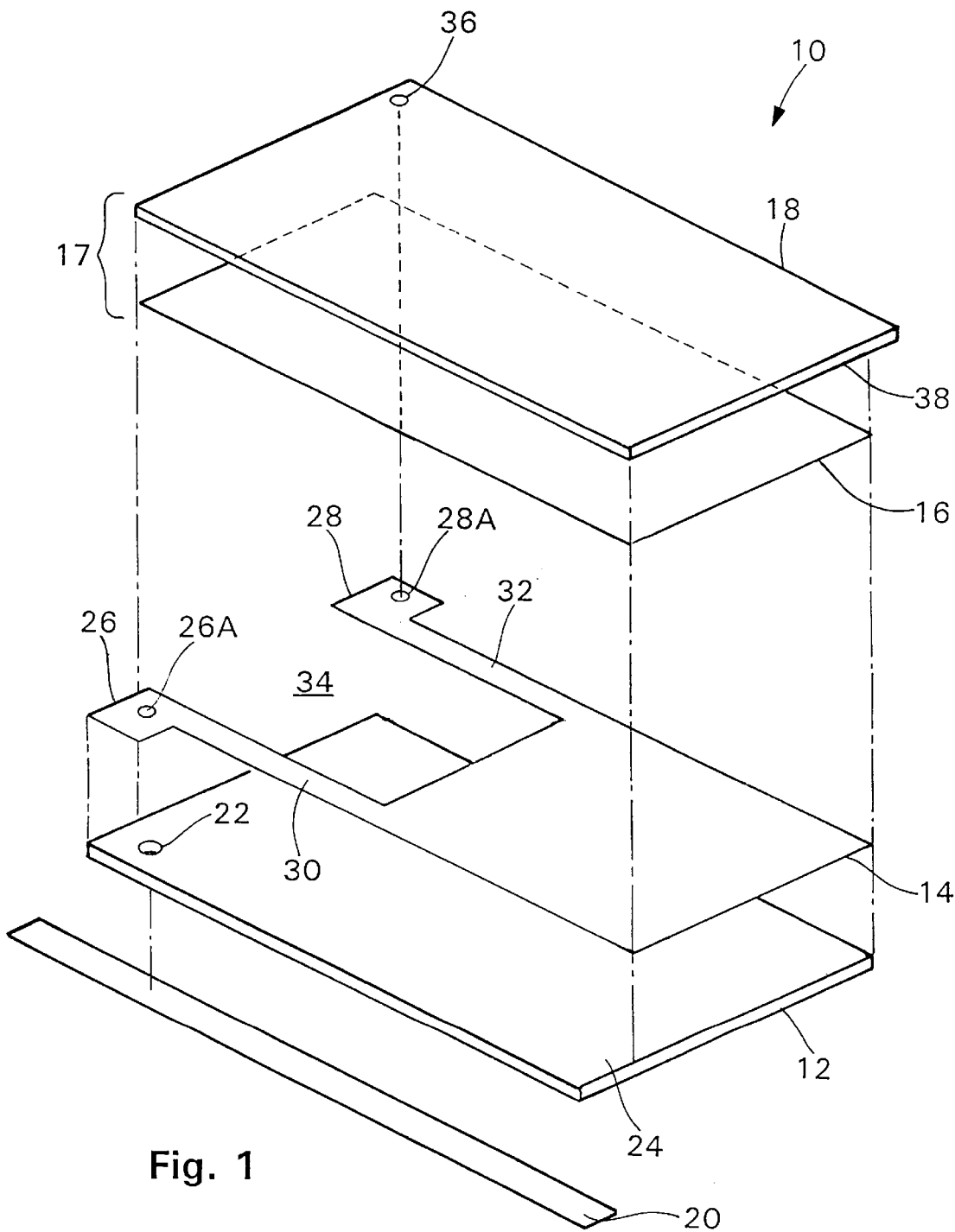
FIG. 1 is an exploded perspective view showing a photovoltaic module in accordance with the present invention.

Certain terminology may be used in the following description for convenience only and is not limiting. The words "left", "right", "upper" and "lower" designate directions in the drawings to which reference is made. The words "inwardly" and "outwardly" refer to directions toward and away from, respectively, the geometric center of the photovoltaic module and designated parts thereof. The terminology includes the words above specifically mentioned, derivatives thereof, and words of similar import.

Referring now to the drawings in detail, wherein like numerals indicate like elements throughout, there is shown in FIG. 1 a photovoltaic module, generally designated 10, that generates a voltage when exposed to radiant energy, such as light. In the preferred embodiment, the photovoltaic module 10 is a shingle such that a plurality of photovoltaic modules 10 can be arranged in rows that cover an exterior portion of a structure, such as a roof or sides of an exterior of a building (not shown), such as a home, office or industrial facility. It is understood by those of ordinary skill in the art that the photovoltaic module 10 may be used in other manners. For instance, the photovoltaic module may also serve as a tile that is used for roofs or other structures to provide an ornamental appearance therefor.

As described in more detail hereinafter the photovoltaic module 10 is preferably laminated with its layers bonded together to produce a package having a desired thickness, shape and strength that is adapted to the particular use selected for the photovoltaic module 10. The photovoltaic module 10 comprises a first layer 12 which serves as a carrier layer and is preferably constructed of a non-porous building material that has sufficient structural integrity to provide the module 10 with a desired degree of rigidity and is capable of withstanding harsh exterior weather conditions without decomposing. In the preferred embodiment the first layer 12 preferably comprises polypropylene. However, it is understood by those of ordinary skill in the art that other non-porous building materials, such as a silicate or ceramic material, recycled PTE, and glass, could be used without departing from the spirit and scope of the invention.

As shown in FIG. 1, the first layer 12 is generally in the form of a rectangle, is generally flat and has a generally uniform thickness. As described in more detail below, the module 10 has a predetermined length and a predetermined width. While it is preferred that the first layer 12 be generally in the form of a flat rectangle, it is understood by those of ordinary skill in the art that the first layer 12 could have other configurations, such as square, without departing from the spirit and scope of the invention.

In the preferred embodiment, the first layer 12 has a guide hole 22 adjacent one corner thereof, dimensioned to accommodate the insertion of a fastener described below with reference to FIGS. 6–9. The guide hole 22 is preferably generally circular in cross section and extends through the entire thickness of the first layer 12.

The module 10 preferably further includes a second or photovoltaic layer 14 which is at least partially laminated with the first layer 12 for generating an electrical current when exposed to light. The second layer 14 is preferably comprised of any one of a number of photovoltaic compounds which, as known in the art, cooperate to generate an electrical current when exposed to light. It is understood by those skilled in the art that the present invention is not limited to constructing the second layer 14 of any particular material so long as an electrical current is generated when exposed to light.

The second layer 14 preferably has a predetermined width which is less than the predetermined width of the first layer 12 and is laminated to the first layer 12 such that a portion of the first layer 12 forms a resting ledge 24, as described in more detail hereinafter. However, it is understood by those of ordinary skill in the art that the second layer 14 could be coterminus with the first layer 12. The second layer 14 includes first and second electrically conductive connectors 26 and 28 respectively located at one end of strips or fingers 30 and 32. The first and second electrically conductive connectors 26 and 28 are comprised of a flexible printed circuit board material, such as a stainless steel foil or mylar, although other conductive composites may be used for these connectors, such as gold and solder, without departing from the spirit and scope of the present invention. The first and second electrically conductive connectors 26 and 28 and the fingers 30 and 32 are formed as integral parts of the second layer 14 using methods such as laminated stampings, wave soldering and/or conductive material printing. Such methods are well understood by those of ordinary skill in the art, accordingly, further description thereof is omitted for purposes of convenience only and is not limiting.

The first electrically conductive connector 26 preferably has a centrally disposed guide hole 26A and is laminated to the first layer 12 with the guide hole 26A in registry with the guide hole 22 of the first layer 12. The guide hole 26A of the first connector 26 is dimensioned in a manner similar to guide hole 22 of the first layer 12. The second electrical connector 28 extends outwardly, in a lateral manner, from the first layer 12 such that the second electrical connector 28 is not laminated to the first layer 12. The first and second electrically conductive connectors 26 and 28 are separated from each other by a non-electrically conductive isolation region 34. The isolation region 34 can be in the form of an air gap or material from the first layer 12 could fill in the isolation region 34. As such, the second layer 14 is arranged so that a first electrical potential having a first polarity is established at the first electrically conductive connector 26 and a second electrical potential having a second polarity, opposite to said first polarity, is established at the second electrically conductive connector 28, both polarities being established when light is received by the photovoltaic materials.

As shown in FIG. 1, the module 10 further includes a translucent layer 17 secured to the second layer 14. The translucent layer 17 covers all of the top surface of the second layer 14 except for the top surface of the first connector 26 which, in combination with the portion of the first layer 12 which is not covered by the second layer 14, forms the resting ledge 24 of the module 10. A portion of the translucent layer 17 extends outwardly from the first and second layers 12, 14 and is laminated to the second connector 28 such that the portion of the translucent layer 17 which extends outwardly from the first and second layers 12, 14 and the second connector 28 form a protruding ledge 38 of the module 10. As a result, the bottom surface of the second connector 28 is exposed to make contact with the exposed top surface of the first connector 26 of another module, as described in more detail hereinafter.

In the preferred embodiment, the translucent layer 17 is preferably laminated to the second layer 14 and serves the purpose of preventing the second layer 14 from being exposed to atmospheric elements and to also assist in securing the module 10 to the exterior structure, as described in more detail hereinafter. It is preferred that the translucent layer 17 be comprised of third and fourth layers 16, 18. The third layer 16 is placed over and laminated with the second layer 16. The third layer 16 preferably fully covers the second layer 14, except for the first connector 26. The third layer 16 is comprised of a translucent anti-corrosive retarding material. It is understood by those of ordinary skill in the art from this disclosure, that the present invention is not limited to constructing the translucent layer 17 of any particular material, as long as the above functions are achieved. For instance, the third layer 16 could be a sprayed-on coating.

The fourth layer 18 is laminated to the third layer 16 and also comprises a translucent material having sufficient structural integrity, which in combination with the first layer 12, provides the module 10 with a sufficient degree of rigidity to allow the module 10 to be secured to the exterior structure. The translucent material of the fourth layer 18 is also capable of withstanding harsh exterior weather conditions without decomposing. The translucent material of the fourth layer 18 preferably comprises polycarbonate. Although other translucent materials, such as a silicate or ceramic material or glass, may be used without departing from the spirit and scope of the invention.

The protruding ledge 38 of the translucent layer 17 and second connector 28 respectively include guide holes 36 and 28A with dimensions similar to guide holes 22 and 26A. The purpose of the guide holes 22, 26A, 36 and 28A is further described below with reference to FIG. 4.

While in the present embodiment, it is preferred that the translucent layer 17 be comprised of the third and fourth layers 16, 18, it is understood by those of ordinary skill in the art that the translucent layer 17 could be constructed of a single layer or more than two layers and still accomplish the same function as the third and fourth layers 16, 18, without departing from the spirit and scope of the invention.

The photovoltaic module 10 is, as to be further described, connected to a conductive bus 20, only partially shown in FIG. 1, which serves as one of the interconnecting leads to establish electrical communication for outputting the electric current generated by the photovoltaic layer 14 to an external power generating or absorbing source both to be described with reference to FIG. 10. The conductive bus 20 comprises a conductive metal or laminate of metal and polymers which is preferably resistive to the corrosive affects of the atmosphere in which the photovoltaic module 10 finds application.

Figure 2:
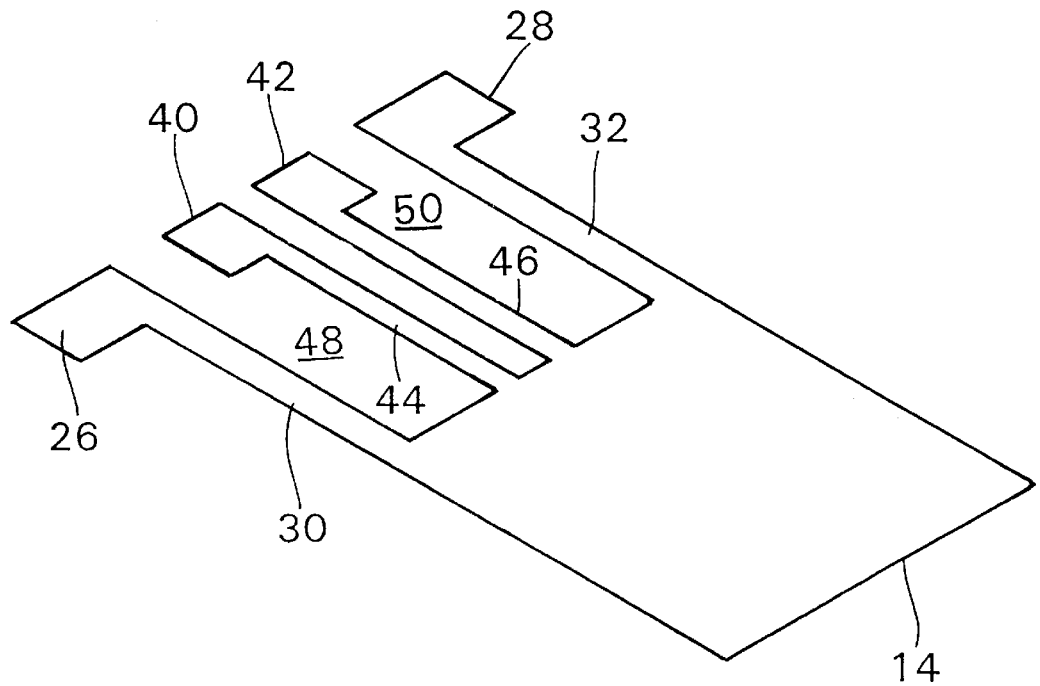
FIG. 2 is a perspective view of an alternate embodiment of a photovoltaic layer of the photovoltaic module.

Referring now to FIG. 2, there is shown an alternate embodiment of the photovoltaic layer 14 which includes two additional electrically conductive connectors, namely third and fourth connectors 40 and 42, respectively situated at one end of fingers 44 and 46. The third and fourth electrically conductive connectors 40 and 42 are interleaved and spaced apart from the first and second electrically conductive connectors 26 and 28 by isolation regions 48 and 50. The photovoltaic layer 14 is preferably constructed such that the first and fourth connectors 26 and 42 are part of an independent circuit which carries the voltage generated by the photovoltaic compounds and the second and third connectors 40 and 28 are part of an independent circuit which carries the voltage generated by the modules back to a dual bus strip (not shown) on one side of the structure.

Figure 3:
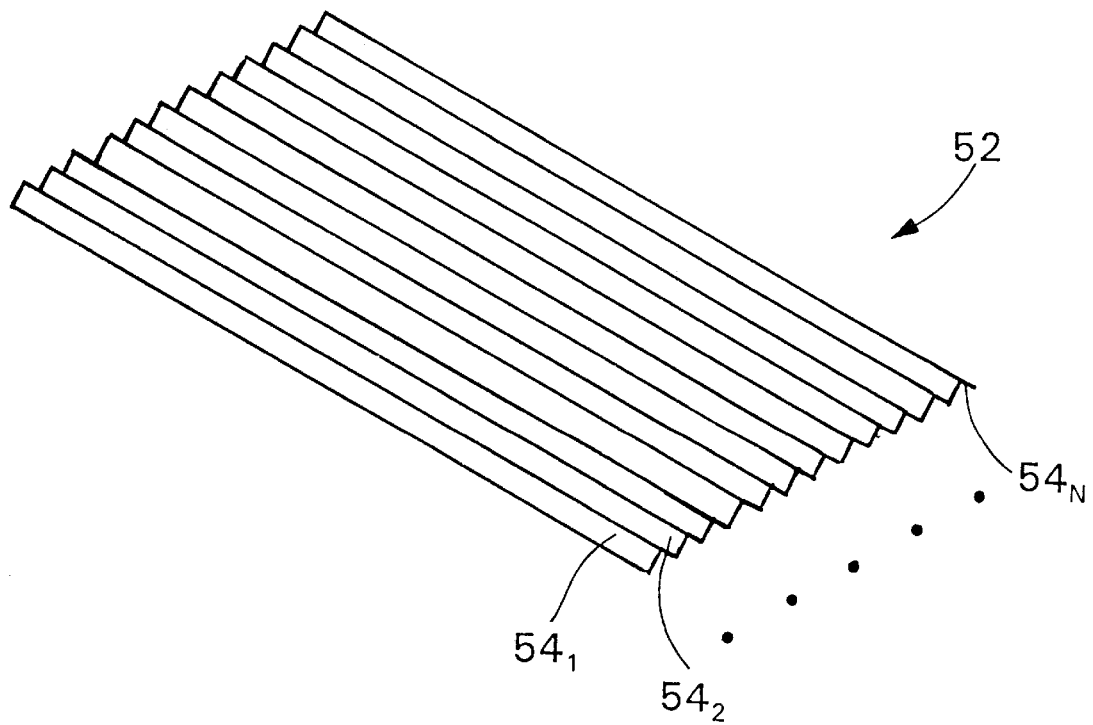
FIG. 3 is a perspective view of a light diffusing member that enhances the distribution of the light intercepting the photovoltaic module of the present invention.

Referring now to FIG. 3, the module 10 may further comprise a light diffuser member 52. The light diffuser member 52 is placed over the second layer 14 and is either formed as part of the translucent layer 17 or can be a separate layer which is laminated onto the translucent layer 17. The light diffuser member 52 distributes the light that falls onto the photovoltaic module 10 more evenly as compared to that which might otherwise occur if the light does not directly impinge upon the module 10. The light diffusing member 52 has a plurality of raised portions $54_1, 54_2 \ldots 54_N$ that act as prisms to disperse and spread the light rays onto the module 10. The light diffuser member 52 is preferably constructed of the same material as the fourth layer 18.

As used herein, the term "laminated" is meant to include any method or structure which secures the layers of the module 10 in facing engagement, including, but not limited to, heat bonding, adhesives, epoxies, mechanical fasteners, etc.

Referring now to FIG. 4, there is shown first and second modules 10A, 10B which are generally identical. To create a solar system, to be applied to a roof of a building for instance, the first and second modules 10A, 10B are arranged so that the protruding ledge 38 of the first module 10A is situated on the resting ledge 24 of the second module 10B such that the second connector 28 of the first module 10A is in electrical communication with the first connector 26 of the second module 10B, as indicated by the arrow 25. The overlapping feature of the present invention readily allows the module 10 to serve as roofing shingles or tiles which are automatically electrically connected without the need for separate wiring or connecting members to create a modular solar system.

Figure 5A:
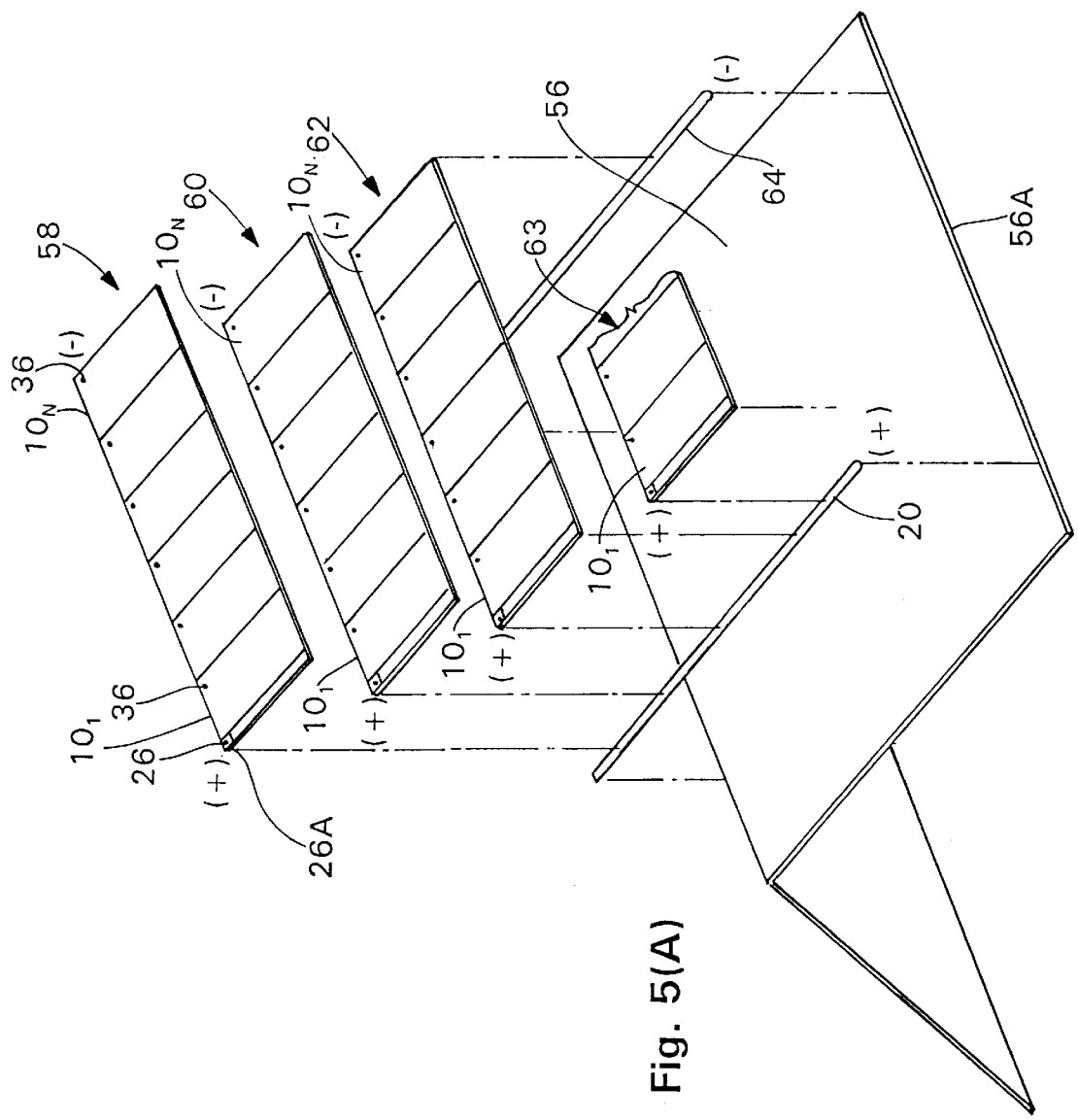
FIG. 5(A) is an exploded perspective view showing the electrical interconnection of a plurality of the photovoltaic modules serving as roofing shingles.

Referring now to FIG. 5(A), there is shown a roof 56 having thereon a plurality of arrays 58, 60, 62 and 63 each comprising a plurality of photovoltaic modules, in the form of shingles, $10_1 \ldots 10_N$. As most clearly seen with reference to the array 58, the modules $10_1$ are arranged so that the first electrically conductive connector 26 is connected to electrically conductive bus 20, whereas the second electrically conductive connector 28 (not shown in FIG. 5(A)) of the photovoltaic shingle 10 is arranged to be connected to a second electrically conductive bus 64. The photovoltaic modules $10_1 \ldots 10_N$ of each array 58, 60, 62 and 63 are serially connected to each other in the manner described above in connection with FIG. 4. Each of the arrays 58, 60, 62 and 63, in turn, is connected in parallel to provide parallel voltage banks, each having a positive (+) potential established and present at electrically conductive bus 20 and a negative (−) potential established and present at the electrically conductive bus 64. The arrays 58, 60, 62, 63 are preferably arranged in a standard overlapping manner. That is, a portion of the array 60 partially overlaps the portion of the array 62 which includes the first and second connectors 26, 28 to allow water to cascade over the modules to the edge 56A of the roof 56, in a manner well understood by those of ordinary skill in the art.

Figure 5B:
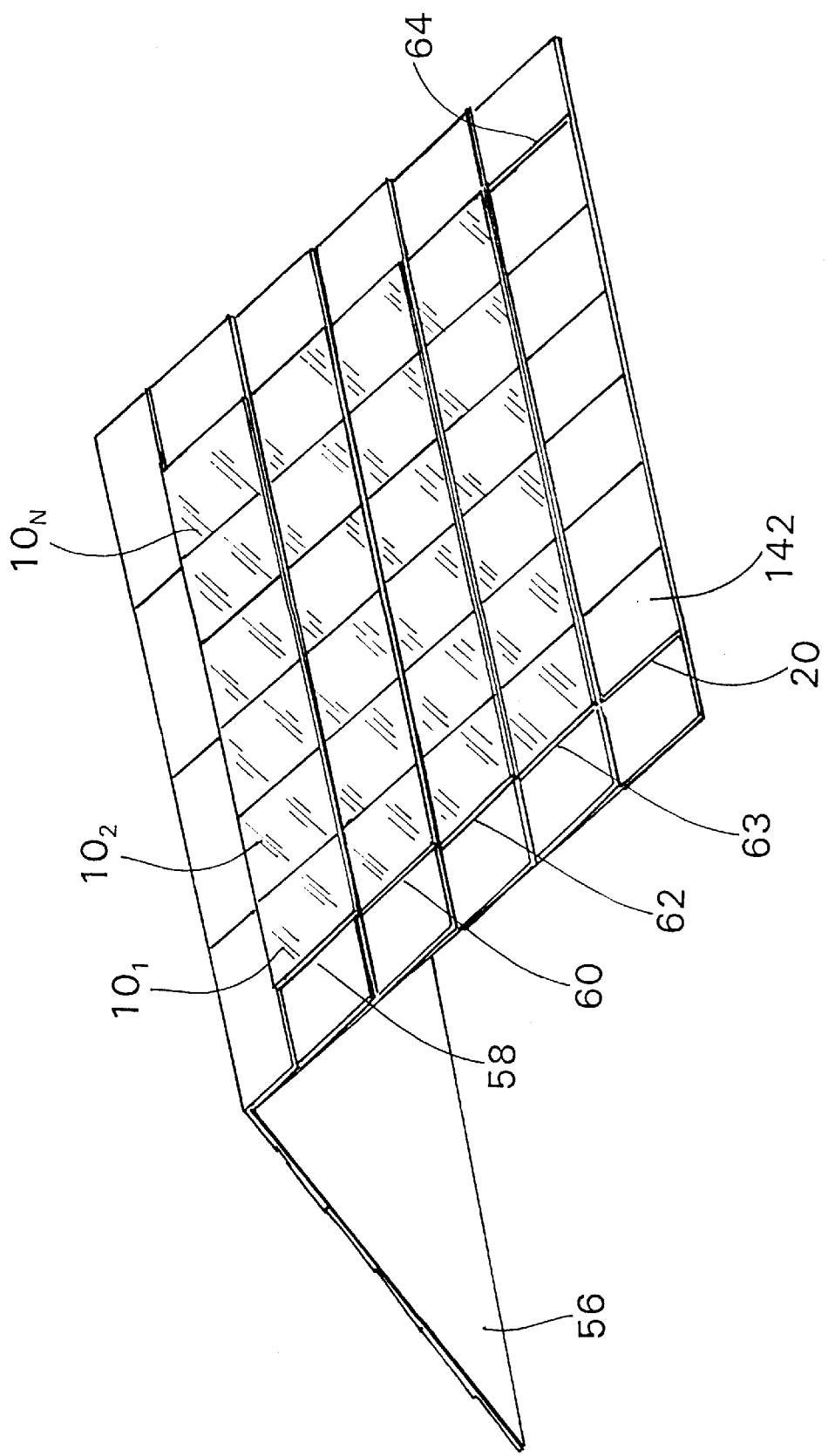
FIG. 5(B) is a partial perspective assembly view of the plurality of the photovoltaic modules shown in FIG. 5(A)
Figure 5C:
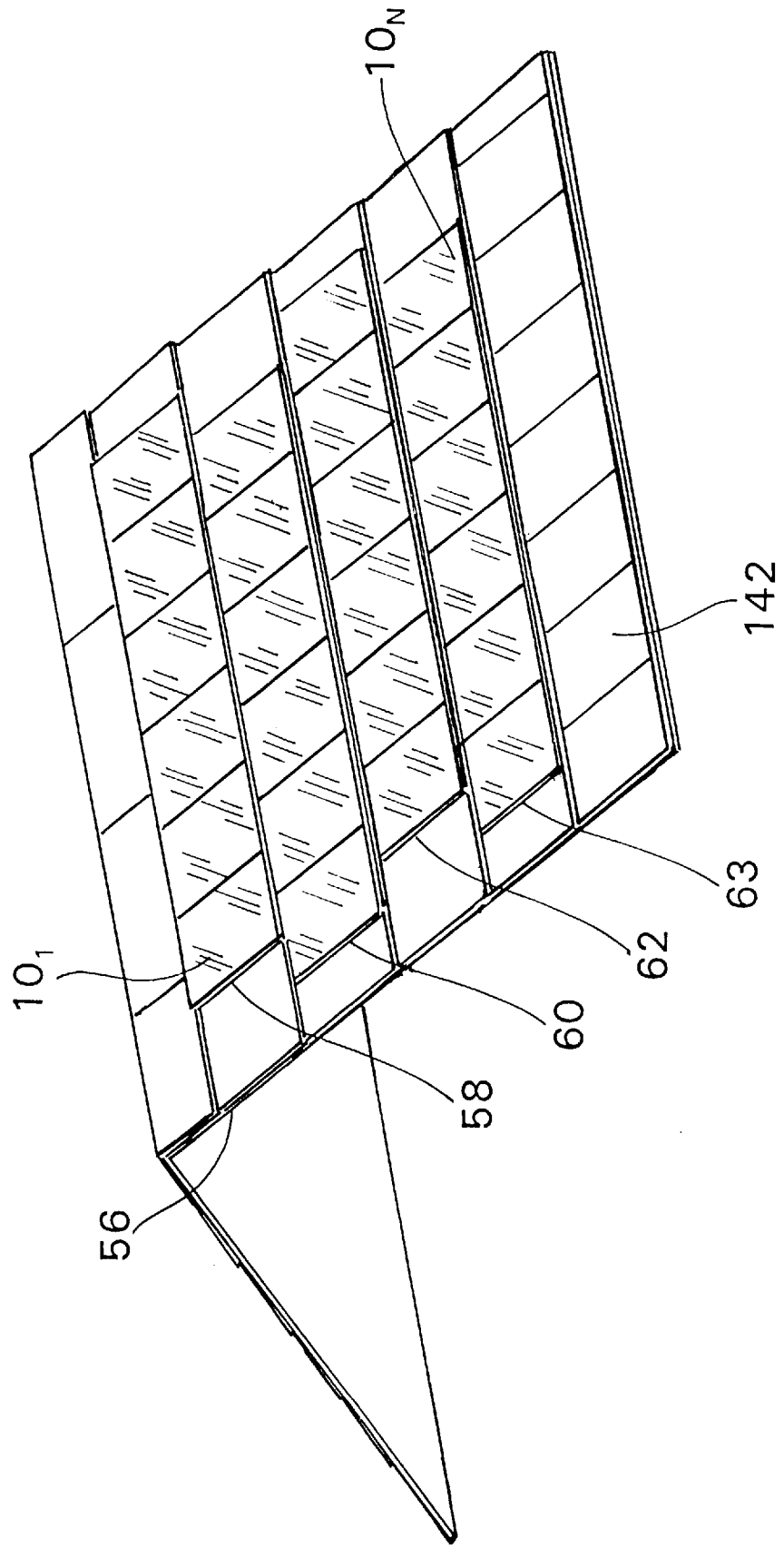
FIG. 5(C) is a partial perspective view which illustrates an alternative arrangement of placing the photovoltaic modules on a roof.

It is understood by those of ordinary skill in the art that the present invention is not limited to arranging the modules 10 in any particular manner. For instance, as shown in FIG. 5(B), the arrays of modules 58, 60, 62, 63 could be surrounded by a boundary of conventional non-photovoltaic shingles 142 or, as shown in FIG. 5(C), the modules 10 could be arranged in a staggered manner. Furthermore, the modules 10 could be configured to match the contour of non-planar surfaces of the building, such as over the apex of a roof.

As most clearly seen with reference to array 58, each photovoltaic module $10_1 \ldots 10_N$ is physically connected to an adjacent module and the roof 56 by means of inserting an appropriate fastener into guide holes 22, 26A or guide holes 36, 28A. The practice of the present invention provides for a variety of mechanical and electrical fasteners which may be described with reference to FIGS. 6(A)–9 that primarily illustrate the placement of the appropriate fasteners into the guide holes 36, 28A of the translucent layer 17 and second connector 28, respectively. However, it is understood by those of ordinary skill in the art that the following description is equally applicable to the placement of fasteners into the guide holes 22, 26A of the first layer 12 and first connector 26, respectively.

Referring now to FIG. 6(A), there is shown a first embodiment of a fastener for electrically and mechanically mating together the first and second modules 10A, 10E which includes a nail 66 having a flat head 66B and a shaft 66A extending therefrom. The protruding ledge 38 of the first module 10A is arranged over the resting ledge 24 of the second module 10B. The protruding ledge 38 is then brought together and merges with the resting ledge 24 such that the guide holes 36, 28A of the first module 10A are in registry with the guide holes 22, 26A of the second module 10B. The shaft 66A is inserted into the guide hole 36 in the protruding ledge 38, the guide hole 28A in the second connector 28, the guide hole 26A in the first connector 26 and the guide hole 22 in the resting ledge 24 of the first layer 12. The nail 66 is then hammered downward to mechanically and physically secure the resting and protruding ledges 24, 38 together, as well as securing the first and second modules 10A and 10B to the roof.

While the first and second connectors 26, 28 can be in direct contact to achieve the requisite electrical connection, in the first embodiment a conductive gel is inserted between the first and second connectors 26, 28 to facilitate the electrical connection. Similarly, in the second, third and fourth embodiments shown in FIGS. 6(B), 6(C), and 6(D), respectively, a conductive adhesive 70, a thermally activated catalytic conductive adhesive 72, and a solder 74, which may be melted and activated by the use of a ring soldering device, are used in place of the conductive gel 68. The conductive adhesive 70, thermally activated catalytic conductive adhesive 72, and solder 74 are all well known in the electrical connection art and, therefore, further description thereof is omitted for purposes of convenience only and is not limiting.

Figures 6E, 6F, 6G:
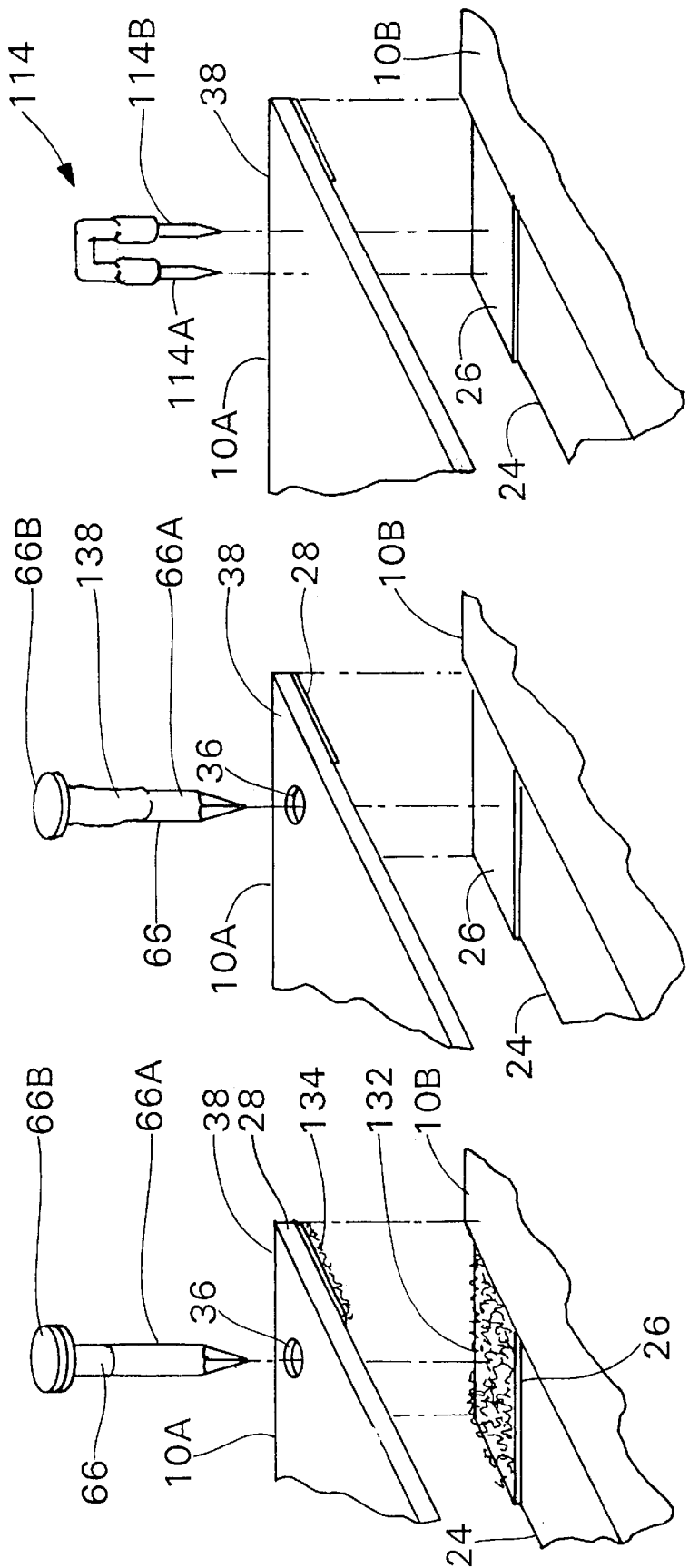
FIG. 6(E) is a greatly enlarged, partial-exploded perspective view which illustrates a fifth embodiment of a fastener for electrically and mechanically mating together first and second photovoltaic modules.
FIG. 6(F) is a greatly enlarged, partial-exploded perspective view which illustrates a sixth embodiment of a fastener for electrically and mechanically mating together first and second photovoltaic modules.
FIG. 6(G) is a greatly enlarged, partial-exploded perspective view which illustrates a seventh embodiment of a fastener for electrically and mechanically mating together first and second photovoltaic modules.

FIG. 6(E) illustrates a fifth embodiment of a fastener for electrically and mechanically connecting together the first and second connectors 26 and 28 which includes a first metal wool-like pad 132 placed over the first connector 26 of the first module 10B and a second metal wool-like pad 134 placed over the second connector 28 of the first module 10A. The first and second module 10A, 10B are then arranged as described above in connection with FIG. 6(A), such that the first and second metal wool-like pads 132 and 134 are in engagement to establish electrical connection therebetween.

FIG. 6(F) illustrates a sixth embodiment of a fastener for electrically and mechanically connecting together the first and second connectors 26 and 28 for securing the protruding ledge 38 of the first module 10A to the resting ledge 24 of the second module 10B. In the sixth embodiment, the nail 66 includes a relatively thick coating of solder 138 on the shaft 66A. It is preferred that the nail 66 be inserted through the guide holes 36, 28A, 26A and 22 and imbedded in the roof using a standard nail gun having a heating core attachment (not shown) to melt the solder 138 and allow it to flow between the first and second connectors 26, 28 and then solidify.

FIG. 6(G) illustrates a seventh embodiment of a fastener for electrically and mechanically connecting together the first and second connectors 26 and 28 for securing the protruding ledge 38 of the first module 10A to the resting ledge 24 of the second module 10B which includes a roofing staple 114 having pointed prongs 114A and 114B, each of which includes a thick coating of solder 138 on the shaft 66A. The roofing staple 114 is imbedded in the roof using a standard nail gun having a heating core attachment (not shown) such that each shaft 114A, 114B physically contacts and engages a protruding ledge 38 of the first module 10A and, similarly, the resting ledge 24 of the second module 10B. The heating core attachment melts the solder 138 to allow it to flow between the first and second connectors 26, 28 and then solidify.

Referring now to FIGS. 7(A) and 7(B), the present invention includes a seventh embodiment of a fastener for electrically and mechanically connecting together the first and second connectors 26 and 28 and for securing the protruding ledge 38 of the first module 10A to the resting ledge 24 of the second module 10B. The seventh embodiment includes a mechanical fastener 116 that not only secures the protruding ledge 38 of the first module 10A to the resting ledge 24 of the second module 10B, but also has an insulating member 122 that provides for electrical isolation of the mechanical fastener 116 from the first and second connectors 26, 28. As seen in FIG. 7(A), the mechanical fastener 116 includes a nail comprising a shaft 118 and a flat head 120. The insulating member 122 is formed of an insulative material, such as vinyl or other polymer. The insulating member 122 includes a tube 124, as well as a crown 126 having a central opening 128 which extends through the tube 124 and is dimensioned to accept the shaft 118.

As shown in FIG. 7(A), the tube 124 and crown 126 separate the shaft 118 and head 120, both normally formed of a metallic material, from both the protruding ledge 38 of the first module 10A and from the resting ledge 24 of the second module 10B. This separation prevents the shaft 118 and head 120 from electrically contacting either of the first and second connectors 26, 28.

Figure 8A:
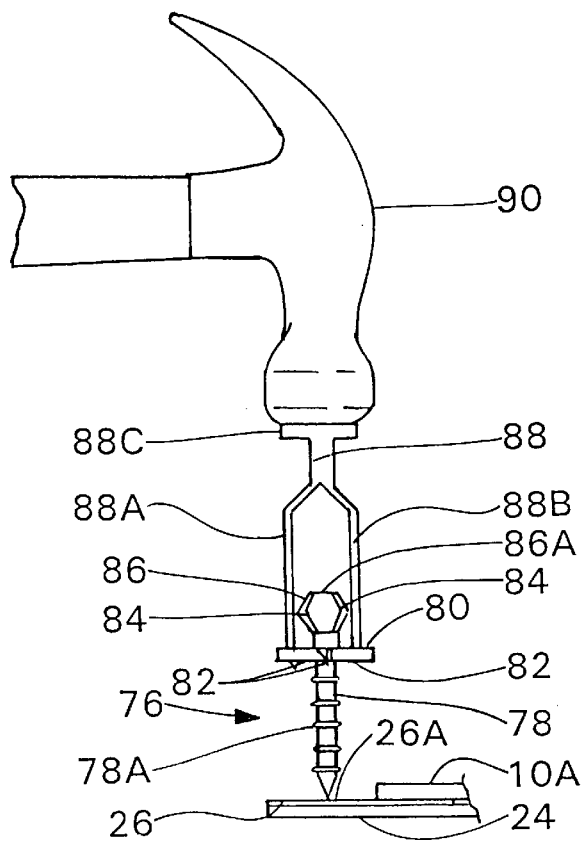
FIGS. 8(A), 8(B), 8(C), 8(D) and 8(E) are elevational views that sequentially illustrate a ninth embodiment of a fastener for mechanically joining first and second photovoltaic modules.
Figure 8B:
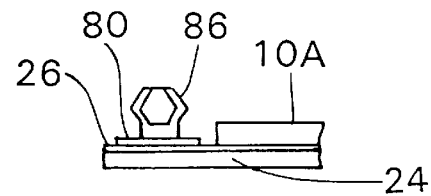

Referring now to FIGS. 8(A) through 8(F), the present invention includes a ninth embodiment of a fastener for electrically and mechanically connecting together the first and second connectors 26 and 28 for securing the protruding ledge 38 of the first module 10A to the resting ledge 24 of the second module 10B. The ninth embodiment includes a nail 76 having a shaft 78 with a series of spaced generally annular protrusions 78A extending outward therefrom, a shoulder 80 with a plurality of prongs 82 for gripping the first connector 26, and a deformable head 86 having an opening 86A and four flared portions 84 that extend outwardly from the opening 86A. A guide member 88 is preferably used for the insertion of the nail 76. More particularly, the guide member 88 includes arms 88A and 88B which engage the shoulder 80 such that the driving force of the hammer 90 is transferred to the shaft 78 through the shoulder 80, to prevent the deformable head 86 from becoming prematurely deformed. That is, the nail 76 is driven, by means of the hammer 90 striking the head 88C of the guide member 88, into the resting ledge 24 of the first module 10A and also into the roof (not shown) on which the first module 10A is laid, as shown in FIG. 8(B).

Figure 8C:
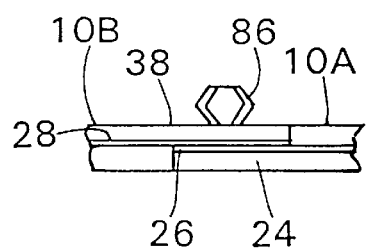

Next, the guide holes 36, 28A of the protruding ledge 38 and second connector 28, respectively, of the second module 10B are placed over the deformable head 86 and pushed downward thereover to obtain a final configuration as shown in FIG. 8(C), wherein the protruding ledge 38 of the second module 10B is mated with the resting ledge 24 of the first module 10A.

Figure 8E:
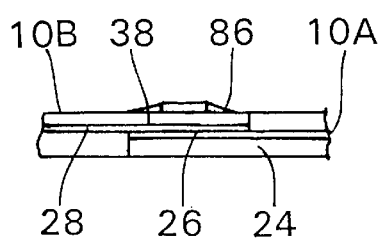
Figure 8D:
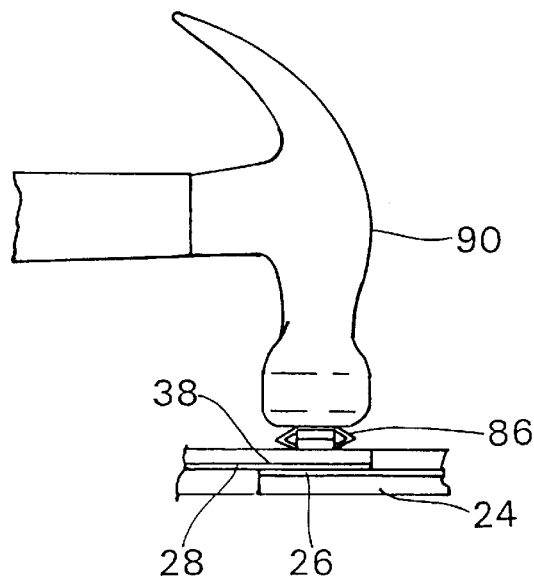

As shown in FIG. 8(D), the hammer 90 is then used, without the use of the guide member 88, to crush and deform the deformable head 86 so that it obtains a crushed condition as shown in FIG. 8(E), whereby the protruding ledge 38 of second module 10B is rigidly and mechanically connected to the resting ledge 24 of the first module 10A which, in turn, electrically connects together the first and second connectors 26 and 28.

Figure 9:
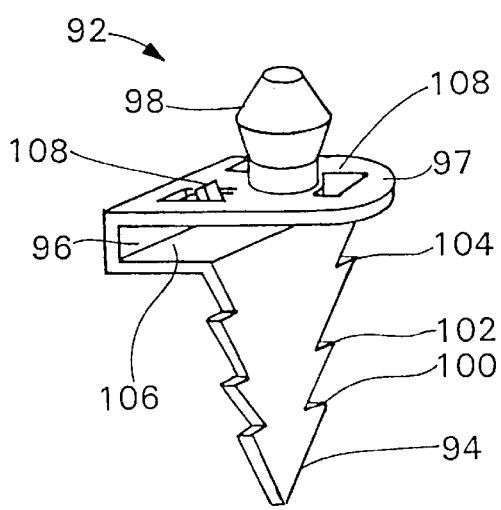
FIG. 9 is a greatly enlarged perspective view of a tenth embodiment of a fastener for mechanically joining the first and second photovoltaic modules.
Figure 8F:
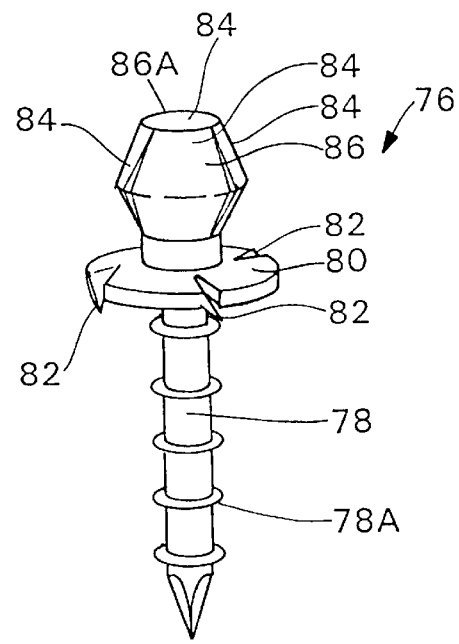
FIG. 8(F) is a greatly enlarged perspective view of the fastener of the ninth embodiment shown in FIG. 8(A)

FIG. 9 illustrates a tenth embodiment of a fastener for electrically and mechanically connecting together the first and second connectors 26 and 28 for securing the protruding ledge 38 of the first module 10A to the resting ledge 24 of the second module 10B. The tenth embodiment includes a roofing connector 92 having a lower portion 94, a middle portion 96, and a top portion 98. The lower portion 94 serves as a shaft and has a pointed lowermost region from which upwardly extends a series of stepped edges 100, 102 and 104. The middle portion 96 has an open cavity 106 dimensioned to snugly fit over and abut the resting ledge 24 of the module 10. The upper portion 98 has a shoulder 97 with a plurality of prongs 108 formed therein for gripping the first connector 26. The roofing connector 92 is used in the same manner as the roofing nail 76 described above in connection with FIGS. 8(A)–(F), except the use of guide holes is unnecessary because the middle portion 96 of the roofing connector 92 grasps the resting ledge 24 of the module 10.

It is understood by those of ordinary skill in the art that the present invention is not limited to any particular manner for securing the resting ledge 24 of the first module 10A to the protruding ledge 38 of the second module 10B. For instance, a first means may be provided for securing the first and second connectors 26, 28 of different modules 10 and a second means may be provided for securing the modules 10 to a building structure.

Figure 10:
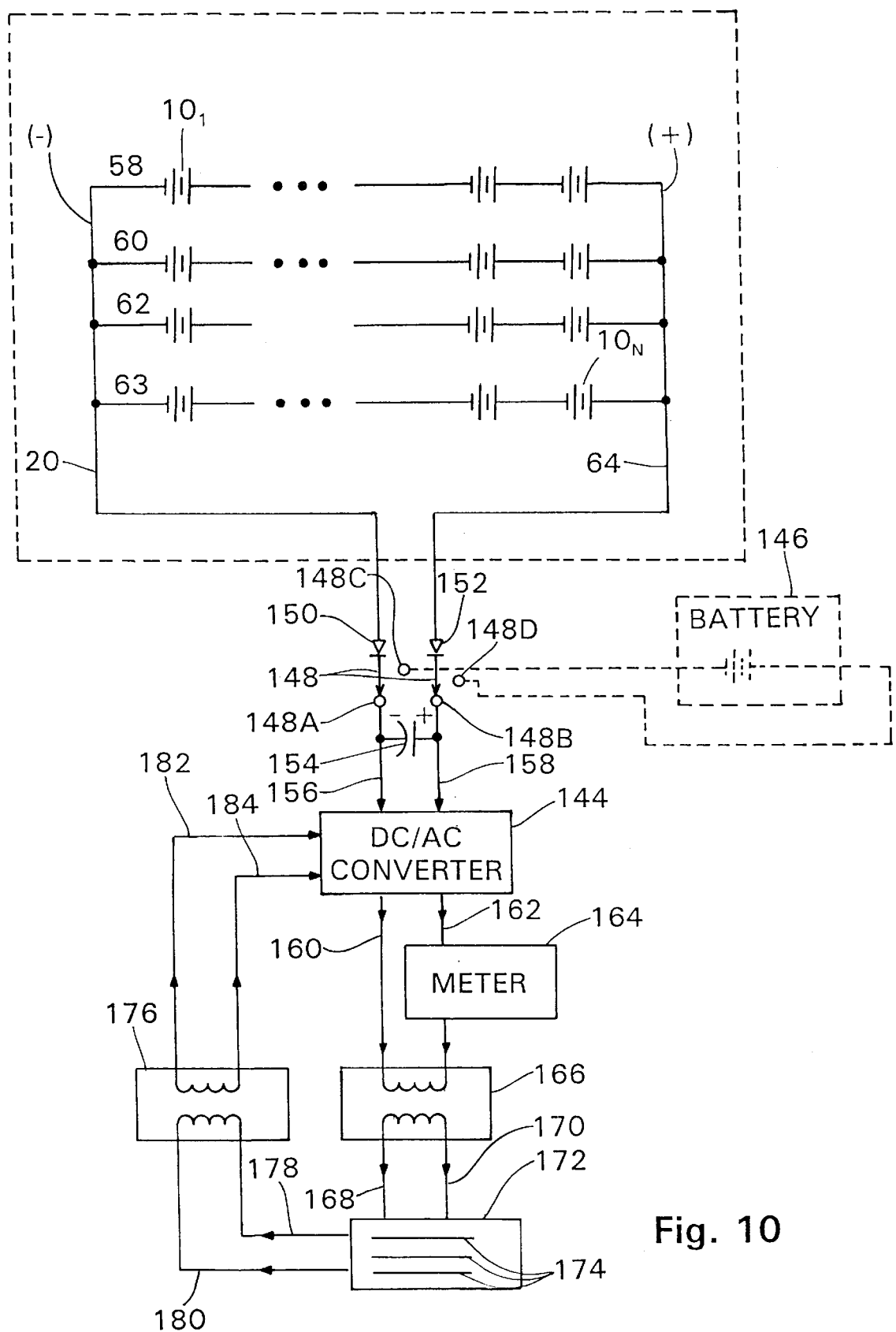
FIG. 10 is a schematic view which illustrates the interconnections of the photovoltaic modules used as roofing shingles that generate and deliver power to a power utility or to a battery located at the building being covered by the shingles.

FIG. 10 schematically illustrates the embodiment shown in FIG. 5(A) of the plurality of photovoltaic modules $10_1 \ldots 10_N$ arranged in arrays 58, 60, 62 and 63, wherein the photovoltaic modules within each array 58, 60, 62 and 63 are serially arranged with each other, but with their additive output connected in parallel across conductive busses 20 and 64. The conductive bus 20 for the embodiment of FIG. 10 establishes a negative (−) potential, and conductive bus 64 establishes a positive (+) potential. The first conductive bus 20 and the second conductive bus 64 are preferably switchably connected, by switch means 148, to either a DC/AC inverter 144, via contacts 148A and 148B, or to the battery 146 via contacts 148C and 148D. The battery 146 at the output stage of the switching means 148 may serve as a source for powering an appliance within the building covered by the photovoltaic module $10_1 \ldots 10_N$ For such an application, a DC/AC inverter (not shown) at the output of the battery 146 should be provided. Unidirectional switching devices, such as diodes 150 and 152, are interposed between the second ends of the first and second conductive busses 20 and 64 and the arrangement of the DC/AC inverter 144 and the battery 146. A storage element, such as a capacitor 154, is interposed across the output stage of the switching modules 148 and across the input stage of the DC/AC inverter 144. The output of capacitor 154 is applied to the DC/AC inverter 144 via signal paths 156 and 158.

As is known in the art, the DC/AC inverter 144 generates a first output signal, on signal paths 160 and 162, having a power factor approaching unity. Any conventional DC/AC inverter 144 may be used so long as it has the capacity to handle the power being generated by the photovoltaic modules $10_1 \ldots 10_N$. An instrument, such as a meter 164, for measuring and indicating the amount of power contained in the first AC output voltage, is interposed between the DC/AC inverter 144 and an isolation transformer 166. The output of the isolation transformer 166, present on signal paths 168 and 170, is routed to the input stage of a power utility 172.

As is also known in the art, the input stage of the power utility 172 has appropriate circuitry that examines the output signal of an isolation transformer, such as isolation transformer 166, for selected parameters, such as its power factor, frequency and phase characteristics, before the circuitry switches such an output signal into the power utility network 172, more particularly, onto the power transmission lines 174. A voltage regulator (not shown) may also be provided for regulating the voltage applied to the utility network 172.

A feedback transformer 176 is interconnected between the input stage of the power utility 172 and a feedback path having appropriate circuitry 186 (not shown) of the DC/AC inverter 144. The feedback transformer 176 is connected to the power utility 172 via signal paths 178 and 180 and to the appropriate circuitry of the feedback path of the DC/AC inverter 144 via signal paths 182 and 184. As is known, the circuitry 186 of the feedback path of the DC/AC inverter 144 responds to the signal on paths 182 and 184 so that the output signal present on paths 160 and 162 is made acceptable to the power utility 172.

It is understood by those of ordinary skill in the art that the practice of the present invention provides for photovoltaic modules that serve as shingles, tiles, or other devices that are exposed to the environment, especially sunlight, and each of which generates an electrical voltage that is cumulatively developed and applied to a DC/AC inverter that may be routed to the transmission lines of a power utility to receive a credit for power generated and/or to an external battery that, in turn, may be used as a source to power household appliances.

Figure 12:
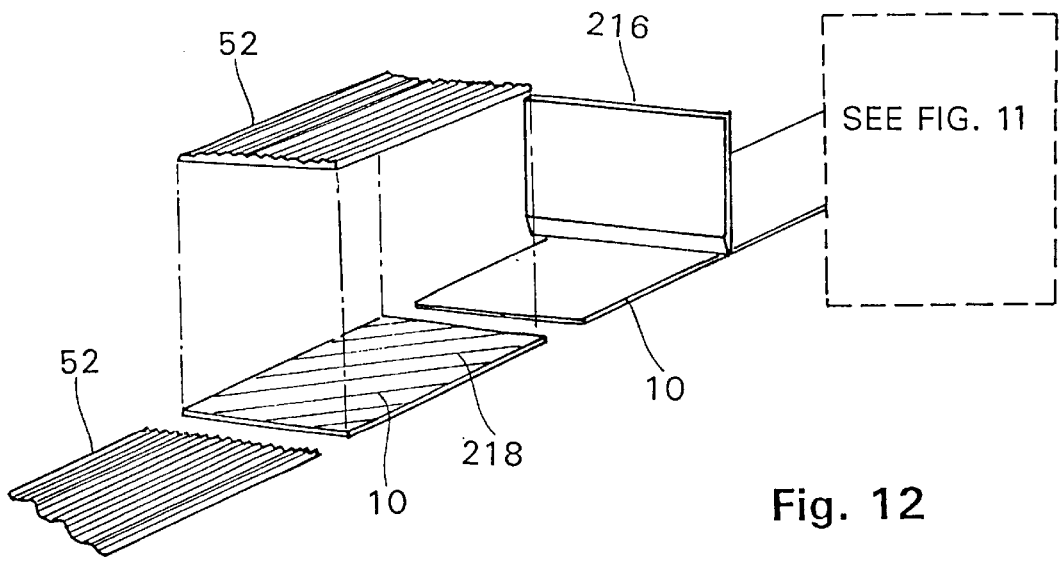
FIG. 12 is a schematic perspective view of a work station used for the placement of a light diffuser member onto a photovoltaic module of the present invention.
Figure 11:
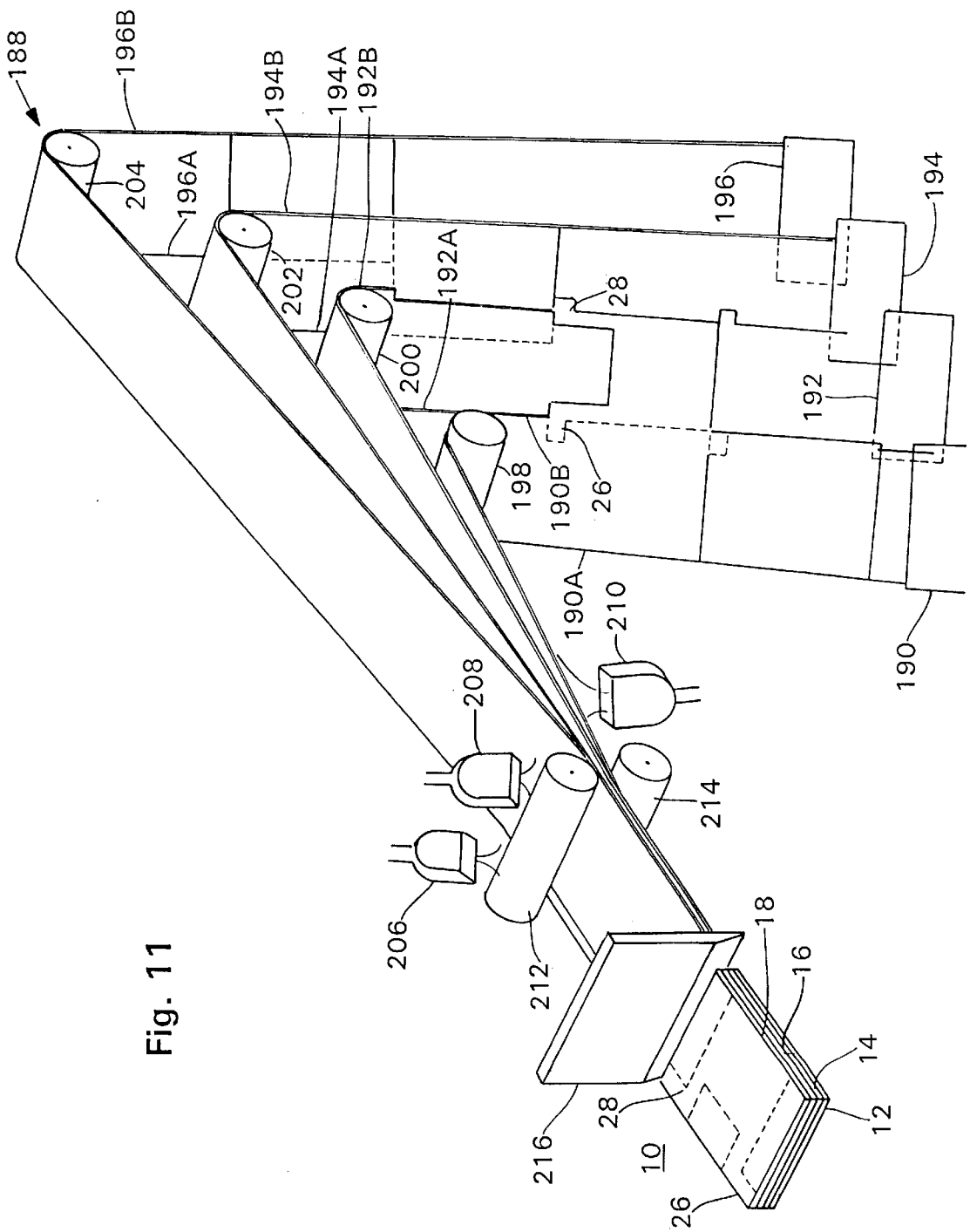
FIG. 11 is a schematic perspective view of the method of assembling the photovoltaic modules of the present invention.

Referring now to FIGS. 11 and 12, there is shown a method for forming a plurality of the photovoltaic modules 10, as described above in connection with FIG. 1. FIG. 11 illustrates an arrangement 188 comprising feed rollers 190, 192, 194, 196 respectively providing a generally continuous sheet of the layers 12, 14, 16 and 18, each having the parameters previously discussed with reference to FIG. 1. The feed rollers 190, 192, 194 and 196 respectively cooperate with guiding and conveying rollers 198, 200, 202 and 204 respectively moving the generally continuous sheets for the first layer 12, the second layer 14, the third layer 16, and the fourth layer 18 all along a respective predetermined path. As seen in FIG. 11, the first layer 12 has edges 190A and 190B that enter onto roller 198, the second layer 14 has edges 192A and 192B that enter onto roller 200, the third layer 16 has edges 194A and 1942 that enter onto roller 202 and, finally, the fourth layer 18 has edges 196A and 196B that enter onto roller 204. As further seen in FIG. 11, the second layer 14 serving as the photovoltaic layer and being moved off of feed roller 192 has electrically conductive connectors 26 and 28 but, if desired, these connectors 26 and 28 may be formed at a separate work station (not shown) of arrangement 188 rather than being preformed before the second layer 14 is placed on the feed roller 192.

The first layer 12, the second layer 14, the third layer 16, and the fourth layer 18 leave the rollers 198, 200, 202 and 204, respectively, and are merged and bonded together, in a facing relationship, by means of heating devices, such as torches 206, 208 and 210, and pressing devices, such as rollers 212 and 214, to be brought together in a laminated manner. If desired, means other than torches 206, 208 and 210, such as self-adhesive coatings or the rollers 212, 214 could be heated, may be used to merge and bond together the first layer 12, second layer 14, third layer 16 and fourth layer 18. The preferably laminated first, second, third and fourth layers 12, 14, 16 and 18 exit rollers 212 and 214 and are intercepted and cut by a severing or cutting blade 216, to provide individual photovoltaic modules 10.

In a manner as previously discussed with reference to FIG. 1, the photovoltaic module 10 needs only comprise the first and second layers 12 and 14, thereby, eliminating the need of the feed rollers 194 and 196, as well as the guiding and conveying rollers 202 and 204. Further, as previously discussed with reference to FIG. 1, the second, third and fourth layers may be combined to again form a two layer photovoltaic module 10, thereby, again eliminating the need for the feed rollers 194 and 196, as well as the guiding and conveying rollers 202 and 204.

As shown in FIG. 12, after the photovoltaic module 10 has been severed by the cutting blade 216, a diffuser member 52 may be positioned and arranged onto the upper surface of the photovoltaic module 10 and may be secured thereto by a suitable adhesive 218, shown in phantom in FIG. 12. It is desired that the adhesive 218 be of a transparent or translucent type to not interfere with the optical characteristic of the light diffuser 52 in its operation of distributing light rays onto the module 10. The light diffusing member 52 may be placed over the fourth layer of a four layer photovoltaic module 10, or over the second layer of a two layer photovoltaic module 10.

It should now be appreciated that the practice of the present invention provides for a method of forming a photovoltaic module that may serve as either a shingle, tile, or other building material that is intended to be placed onto the exterior of a structure and develop a voltage that may be used to provide supplementary power for a household or for a power utility.

It will be appreciated by those skilled in the art that changes and modifications may be made to the above described embodiments without departing from the inventive concept thereof. It is understood, therefore, that the present invention is not limited to particular embodiments disclosed, but is intended to include all modifications and changes which are within the scope and spirit of the invention as defined by the appended claims.

What is claimed is:

1. A method of producing a plurality of photovoltaic modules for use in covering exterior structures, the method comprising the steps of:

providing a first feed roller having a first sheet of a non-porous building material thereon, the first sheet comprising a plurality of carrier elements, each carrier element including first and second opposing lateral sides and upper and lower surfaces, the upper surface of the carrier element defining a resting ledge extending inwardly a predetermined distance from the first side;

providing a second feed roller having a second sheet thereon, the second sheet comprising a plurality of photovoltaic elements, each photovoltaic element for generating a DC voltage when exposed to light, the photovoltaic element including first and second electrical connectors for outputting the DC voltage generated by the photovoltaic element;

moving the first and second sheets each in a predetermined path;

forming a plurality of individual modules by repeatedly:
aligning a photovoltaic element from the second sheet with a carrier element from the first sheet and at least partially laminating the aligned photovoltaic element to the aligned carrier element such that the first connector of the aligned photovoltaic element is laminated on and forms a part of the resting ledge of the aligned carrier element, and such that the second connector of the aligned photovoltaic element extends beyond the second side of the aligned carrier element; and separating the aligned laminated elements from the first and second sheets to form an individual one of the modules;

wherein the extended second connector of the aligned photovoltaic element of a first one of the modules is positionable to rest on the resting ledge of a second one of the modules such that the second connector of the first one of the modules is in electrical communication with the first connector on the resting ledge of the second one of the modules.

2. The method of claim 1 further comprising the steps of:

providing a third feed roller having a third sheet of translucent material thereon, the third sheet comprising a plurality of translucent elements thereon; and moving the third sheet in a predetermined path;

wherein the forming step further comprises the step of aligning a translucent element from the third sheet with the aligned photovoltaic element from the second sheet and laminating the aligned translucent element to the aligned photovoltaic element such that the aligned translucent element covers all of the aligned photovoltaic element except for the first connector thereof, and such that a protruding portion of the aligned translucent element extends beyond the second side of the aligned carrier element a predetermined distance and is laminated to the second connector of the aligned photovoltaic element such that the protruding portion and the second connector form a protruding ledge;

wherein the separating step comprises separating the aligned laminated elements from the first, second, and third sheets to form an individual one of the modules; and wherein the protruding ledge of a first one of the modules is positionable to rest on the resting ledge of a second one of the modules such that the second connector on the protruding ledge of the first one of the modules is in electrical communication with the first connector on the resting ledge of the second one of the modules.

3. The method of claim 2 further comprising the steps of:

providing a fourth feed roller having a fourth sheet of corrosive retarding material thereon, the fourth sheet comprising a plurality of corrosive retarding elements thereon; and moving the fourth sheet in a predetermined path;

wherein the forming step further comprises the step of aligning a corrosive retarding element from the fourth sheet with the aligned translucent element from the second sheet and laminating the aligned corrosive retarding element to the aligned translucent element such that the aligned translucent element covers all of the aligned photovoltaic element except for the first connector thereof, and such that a protruding portion of the aligned corrosive retarding element extends beyond the second side of the aligned carrier element a predetermined distance and is laminated to the protruding portion of the aligned translucent element; and wherein the separating step comprises separating the aligned laminated elements from the first, second, third, and fourth sheets to form an individual one of the modules.

4. The method of claim 1 further comprising the step of positioning a light diffusing element onto each photovoltaic element.

* * * * *